(12) United States Patent
Cyrusian

(10) Patent No.: US 9,130,582 B2
(45) Date of Patent: Sep. 8, 2015

(54) SYSTEMS AND METHODS FOR CORRECTING AN OFFSET AT AN OUTPUT OF A DIGITAL TO ANALOG CONVERTER

(71) Applicant: Marvell World Trade Ltd., St. Michael (BB)

(72) Inventor: Sasan Cyrusian, Scotts Valley, CA (US)

(73) Assignee: MARVELL WORLD TRADE LTD., St. Michael (BB)

( * ) Notice: Subject to any disclaimer, the term of this patent is extended or adjusted under 35 U.S.C. 154(b) by 6 days.

(21) Appl. No.: 14/062,308

(22) Filed: Oct. 24, 2013

(65) Prior Publication Data

US 2014/0049414 A1 Feb. 20, 2014

Related U.S. Application Data

(63) Continuation of application No. 13/313,455, filed on Dec. 7, 2011, now Pat. No. 8,570,199.

(60) Provisional application No. 61/420,614, filed on Dec. 7, 2010.

(51) Int. Cl.

| | |
|---|---|
| *H03M 1/06* | (2006.01) |
| *H03M 1/08* | (2006.01) |
| *H04B 3/54* | (2006.01) |
| *H04L 27/26* | (2006.01) |
| *H03M 1/74* | (2006.01) |
| *H03M 1/00* | (2006.01) |
| *H04L 25/06* | (2006.01) |
| *H03M 1/12* | (2006.01) |

(52) U.S. Cl.
CPC .............. *H03M 1/0845* (2013.01); *H03M 1/00* (2013.01); *H03M 1/0682* (2013.01); *H03M 1/12* (2013.01); *H03M 1/742* (2013.01); *H03M 1/747* (2013.01); *H04B 3/54* (2013.01); *H04L 25/067* (2013.01); *H04L 27/2647* (2013.01)

(58) Field of Classification Search
CPC ......... H03M 1/00; H03M 1/12; H03M 1/747; H04L 25/067; H04L 27/2647; H04B 3/54
USPC ........... 341/118, 120, 144; 375/340, 316, 259
See application file for complete search history.

(56) References Cited

U.S. PATENT DOCUMENTS

| | | | |
|---|---|---|---|
| 5,525,985 A | 6/1996 | Schlotterer et al. | |
| 5,614,903 A | 3/1997 | Oyama | |
| 6,388,658 B1 | 5/2002 | Ahern et al. | |
| 6,639,534 B2 | 10/2003 | Khoini-Poorfard et al. | |
| 6,751,272 B1* | 6/2004 | Burns et al. ................... | 375/340 |
| 7,944,386 B2 | 5/2011 | Hurrell et al. | |
| 2008/0001803 A1 | 1/2008 | Yamaji | |
| 2010/0141493 A1 | 6/2010 | Cho et al. | |

OTHER PUBLICATIONS

International Search Report and Written Opinion from International Application No. PCT/US2011/063706 filed Dec. 7, 2011.

* cited by examiner

*Primary Examiner* — Joseph Lauture

(57) ABSTRACT

A system including a converter, a buffer, and an offset adjust circuit. The converter is configured to provide, based on a digital input signal, a first output current. The buffer is configured to provide, based on the first output current, a second output current to an output pin. The offset adjust circuit is in communication with the first output current and is configured to, based on the second current at the output pin, adjust the first output current to compensate for a current offset at the output pin.

17 Claims, 6 Drawing Sheets

SYSTEMS AND METHODS FOR CORRECTING AN OFFSET AT AN OUTPUT OF A DIGITAL TO ANALOG CONVERTER

CROSS REFERENCE TO RELATED APPLICATIONS

This application is a continuation of U.S. application Ser. No. 13/313,455, (now U.S. Pat. No. 8,570,199), filed Dec. 7, 2011, which claims the benefit of priority from U.S. Provisional Application No. 61/420,614, filed Dec. 7, 2010, entitled "VIDEO DAC" the entire disclosure of which is hereby incorporated herein by reference.

FIELD OF USE

The present disclosure relates to electronic circuits, and in particular, to digital-to-analog converter circuits and methods.

BACKGROUND

Electronic circuits typically operate on two types of signals—digital signals and analog signals. Digital signals are binary values that are typically represented in an electronic circuit by two discrete voltage or current levels (e.g., 0 and 3.3 volts). Digital signals often represent real world phenomena using binary values that are manipulated using digital logic circuits, digital signal processing circuits, or microprocessors, for example. Analog signals are continuous in time and have a continuous range of values corresponding to real world phenomena.

Digital-to-analog converters (DACs) are used to translate digital signals into analog signals. For example, a video DAC may receive a digital representation of a video signal and translate the digital video signal into an analog video signal. FIG. 1 illustrates one stage of a DAC 100. DAC 100 may include a current source 104 generating a current I1x and switches 106 and 108. Power supply voltage Vdx 102 connects to DAC 100 to supply current and voltage, which is returned through ground 120. Digital signals are used to control multiple switching stages of the type shown in FIG. 1 to drive an output pin 110. Pin 110 serves as a connection to a load, which may include resistor R1x 112 in parallel a transmission path 114 and resistor R2x 116.

DAC 100 as shown in FIG. 1 is commonly referred to as a current steering DAC. Current I1x from current source 104 is steered by opening and closing switches 106 and 108 in response to digital signals. When switch 106 is open, switch 108 is closed, and current I1x flows to pin 110. When switch 106 is closed, switch 108 is open, and current I1x flows to ground. Because I1x is always on, current steering DACs may convert digital signals to an analog signal at pin 110 at very high speeds and are useful in video applications, for example.

DAC 100 operates as long as there is enough headroom in the supply voltage Vdx 102 so that current source 104 is approximately ideal. However, as the supply voltage Vdx 102 becomes lower, voltage drops across internal devices of DAC 100 may cause the circuit to become inoperable. For example, current source 104 and switch 108 may be implemented using three series connected transistors—one for the current source and two more for a cascode current steering stage. As the supply voltage drops, the series connected transistor may not have sufficient voltage to operate properly.

Thus, it would be advantageous to provide improved DACs that are less sensitive to variations in power supply voltages.

SUMMARY

The present disclosure provides for improved DAC circuits and methods. In one embodiment, a digital-to-analog converter receives a digital signal and outputs a first analog output signal corresponding to the digital signal. A current buffer receives the first analog output signal and generates an analog output current. The current output digital-to-analog converter and the current buffer are constructed on an integrated circuit, and the analog output current is coupled to a pin of the integrated circuit. The pin of the integrated circuit receives the analog output current and provides the analog output current to additional circuitry external to the integrated circuit.

Particular embodiments include a circuit comprising a current output digital-to-analog converter, where the current output digital-to-analog converter receives a digital signal and outputs a first analog output current corresponding to the digital signal, a current buffer, where the current buffer receives the first analog output current and generates a second analog output current, where the current output digital-to-analog converter and the current buffer are constructed on an integrated circuit, and where the second analog output current is coupled to a pin of the integrated circuit, and wherein the pin receives the second analog output current and provides the second analog output current to additional circuitry external to the integrated circuit.

In one embodiment, the current buffer comprises an amplifier having a first input, second input, and an output, wherein an output of the current output digital-to-analog converter is coupled to the first input of the amplifier, a first resistor coupled between the output of the current output digital-to-analog converter and a power supply terminal, a second resistor coupled between the second input of the amplifier and the power supply terminal, and a transistor having a control terminal coupled to the output of the amplifier, a first terminal coupled to the second input of the amplifier, and a second terminal coupled to the pin of the integrated circuit.

In one embodiment, the additional circuitry comprises a first external resistor coupled between the pin and ground, a transmission path having an input coupled to the pin, and a second external resistor coupled between an output of the transmission path and ground.

In one embodiment, the circuit further comprise a first offset adjust circuit, wherein the first offset adjust circuit sources current to or sinks current from an input of the current buffer to compensate for an offset of the current buffer.

In one embodiment, the circuit further comprises a calibration circuit, the calibration circuit having an input coupled to the pin to sense a voltage on the pin generated in response to the second analog output current and an output coupled to the first offset adjust circuit, wherein the calibration circuit adjusts the current sourced to or sinked from the input of the current buffer.

In one embodiment, the current output digital-to-analog converter outputs a third analog output current that is complementary to the first analog output current, wherein the current buffer is a first current buffer, the circuit further comprising a second current buffer, the second current buffer receiving the third analog output current and generating a fourth analog output current, and wherein the fourth analog output current is complementary to the second analog output current so that the net current drawn by the first current buffer and second current buffer is substantially constant.

In one embodiment, the circuit further comprises a first offset adjust circuit and a second offset adjust circuit, wherein the first offset adjust circuit sources or sinks current to an input of the first current buffer to compensate for an offset of the first current buffer and the second offset adjust circuit sources or sinks current to an input of the second current buffer to compensate for an offset of the second current buffer.

In one embodiment, the current output digital-to-analog converter outputs the first analog output current corresponding to the digital signal based on a reference current, the circuit further comprising an adjustable gain circuit for changing the reference current.

Particular embodiments include a method comprising receiving a digital signal in a current output digital-to-analog converter, wherein the digital-to-analog converter is constructed on an integrated circuit, converting, on the integrated circuit, the digital signal to a first analog output current representation of the digital signal, converting, on the integrated circuit, the first analog output current to an analog voltage, converting, on the integrated circuit, the analog voltage to a second analog output current, and coupling the second analog output current to a pin of the integrated circuit, wherein the pin receives the second analog output current and provides the second analog output current to additional circuitry external to the integrated circuit.

In one embodiment, converting the first analog output current to the analog voltage is performed using a first resistor on the integrated circuit, and wherein converting the analog voltage to the second analog output current is performed using a second resistor on the integrated circuit.

In one embodiment, the method further comprises coupling the second analog output current to double terminated transmission path external to the integrated circuit, the double terminated transmission path having near termination coupled to the pin and a far termination.

In one embodiment, the method further comprises adjusting an offset of the second analog output current, said adjusting comprising generating an offset current by sourcing current to or sinking current from the first analog output current.

In one embodiment, the method further comprises calibrating the current output digital-to-analog converter, said calibrating comprising sensing a voltage at the pin of the integrated circuit generated in response to the second analog output current, and adjusting the offset current to change an amount of said sourcing current or said sinking current so that the voltage at the pin meets a threshold.

In one embodiment, the analog voltage is a first analog voltage, and the method further comprises converting the digital signal to a third analog output current that is complementary to the first analog output current on the integrated circuit, converting the third analog output current to a second analog voltage, and converting the second analog voltage to a fourth analog output current, wherein the fourth analog output current is complementary to the second analog output current so that the net current drawn by a portion of the integrated circuit performing said converting the first analog output current to the first analog voltage, said converting the first analog voltage to the second analog output current, said converting of the third analog output current to the second analog voltage, and said converting the second analog voltage to a fourth analog output current is substantially constant.

In one embodiment, the method further comprises adjusting a first offset, said adjusting the first offset comprising generating a first offset current by sourcing current to or sinking current from the first analog output current and adjusting a second offset, said adjusting the second offset comprising generating a second offset current by sourcing current to or sinking current from the third analog output current.

In one embodiment, the current output digital-to-analog converter outputs the first analog output current corresponding to the digital signal based on a reference current, the method further comprising changing the reference current to adjust a gain of the current output digital-to-analog converter.

Particular embodiments may include a circuit comprising a current output digital-to-analog converter, the current output digital-to-analog converter receiving a digital signal and outputting a first analog output current corresponding to the digital signal and means for buffering the first analog output current and generating a second analog output current, wherein the current output digital-to-analog converter and said means for buffering are constructed on an integrated circuit, and wherein the second analog current signal is coupled to a pin of the integrated circuit, and wherein the pin receives the second analog current signal and provides the second analog current signal to additional circuitry external to the integrated circuit.

In one embodiment, the circuit further comprises means for changing the offset of the second analog output current to control an offset at the pin.

In one embodiment, the circuit further comprises means for changing the gain of the current output digital-to-analog converter.

In one embodiment, the current output digital-to-analog converter outputs a third analog output current complementary to the first analog output current and wherein the means for buffering further comprises means for buffering the third analog output current and generating a fourth analog output current complementary to the second analog output current to maintain a substantially constant net current drawn by said means for buffering.

Particular embodiments may include a circuit comprising a digital-to-analog converter, the digital-to-analog converter receiving a digital signal and outputting a first analog output signal corresponding to the digital signal, a current buffer, wherein the current buffer receives the first analog output signal and generates an analog output current, wherein the digital-to-analog converter and the current buffer are constructed on an integrated circuit, and wherein the analog output current is coupled to a pin of the integrated circuit, and a double terminated transmission path external to the integrated circuit, the double terminated transmission path having near termination coupled to the pin and a far termination.

In one embodiment, the near termination of the double terminated transmission path comprises a first resistor coupled between the pin and a ground and the far termination of the double terminated transmission path comprises a second resistor coupled a far terminal of the transmission path and said ground.

In one embodiment, the first analog output signal is a first analog output current. In one embodiment, the first analog output signal is a first analog output voltage.

The following detailed description and accompanying drawings provide a better understanding of the nature and advantages of the present disclosure.

DETAILED DESCRIPTION

Described herein are DAC circuits and methods. In the following description, for purposes of explanation, numerous examples and specific details are set forth in order to provide a thorough understanding of the present disclosure. It will be evident, however, to one skilled in the art that the present disclosure as defined by the claims may include some or all of the features in these examples alone or in combination with other features described below, and may further include modifications and equivalents of the features and concepts described herein.

Figure 1:
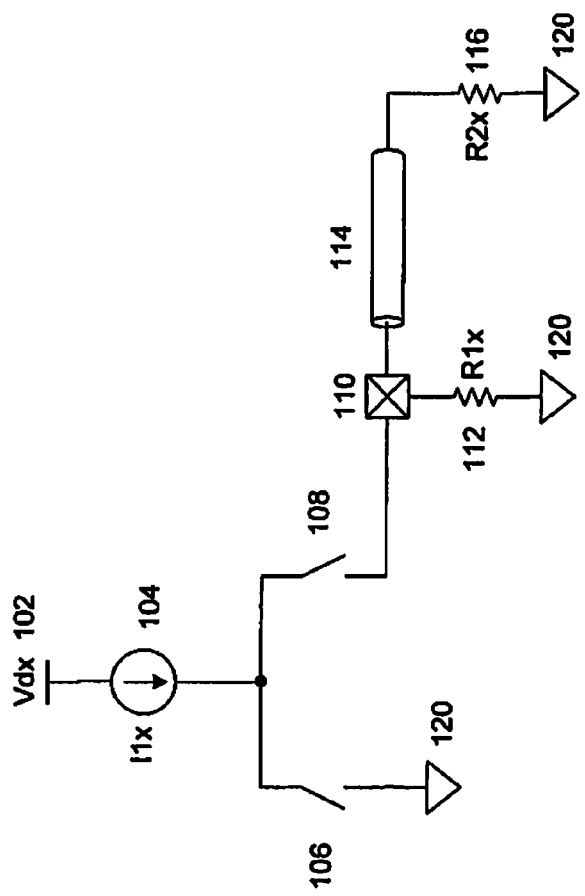
FIG. 1 illustrates a prior art DAC.
Figure 2:
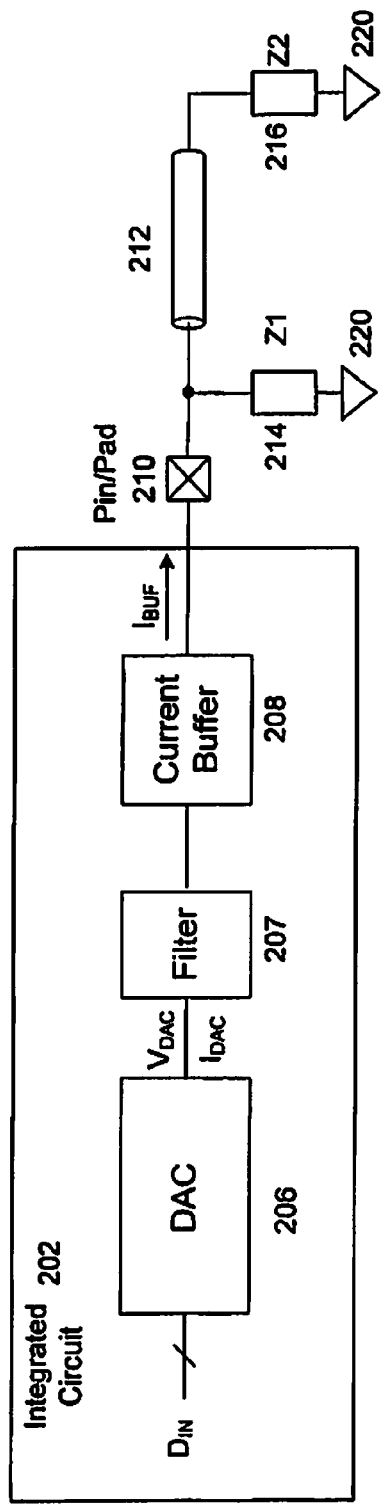
FIG. 2 illustrates a DAC according to one embodiment.

FIG. 2 illustrates a DAC 206 according to one embodiment. Embodiments of the present invention include DACs that output an analog voltage signal or analog current signal. For instance, in one embodiment, DAC 206 receives a digital signal $D_{IN}$ and outputs a first analog output current $I_{DAC}$ corresponding to the digital signal $D_{IN}$. One example of a current output DAC is a DAC having a current steering architecture comprising multiple stages of differential transistors alternately routing current between an output and another path (e.g., ground). In other embodiments, DAC 206 may output an analog output voltage $V_{DAC}$, where a current is translated into a voltage inside the DAC using an impedance, for example. In some embodiments, an analog output current or voltage signal may be received at the input of a filter 207. Filter 207 may be a low pass filter, for example, constructed on the same integrated circuit as DAC 206. The output of DAC 206 (or optionally, filter 207) is coupled to the input of a current buffer 208. A current buffer 208 receives the first analog output current $I_{DAC}$ and generates a second analog output current $I_{BUF}$. In the case of a voltage output DAC, current buffer 208 may receive a voltage and generate second analog output current $I_{BUF}$. DAC 206 and current buffer 208 are constructed on an integrated circuit 202. In one example embodiment described in more detail below, current buffer 208 converts $I_{DAC}$ into an analog voltage and then converts the analog voltage back into the second analog output current $I_{BUF}$. The second analog output current $I_{BUF}$ is coupled to a pin (or pad) 210 of the integrated circuit 202. Pin 210 may be a pin of an integrated circuit package or a pad on an integrated circuit. The term pin is used herein to include both.

Pin 210 of the integrated circuit 202 receives the second analog output current $I_{BUF}$ and provides the second analog output current $I_{BUF}$ to additional circuitry external to the integrated circuit 202. For example, as illustrated in FIG. 2, additional circuitry external to the integrated circuit 202 is shown as impedance Z1 214, which is connected to pin 210 of the integrated circuit 202, a transmission path 212 (e.g., a conductor), and impedance Z2 216, which is coupled to pin 210 of the integrated circuit 202 through the transmission path 212. Impedance Z1 214 is often referred to as a near termination (e.g. near pin 210 of the integrated circuit 202) and impedance Z2 216 is often referred to as a far termination (e.g. on the other (far) end of transmission path 212 from pin 210). As illustrated in FIG. 2, impedance Z1 214 is in a parallel electrical arrangement through transmission path 212 with impedance Z2 216. This parallel termination arrangement is often referred to as a double terminated transmission path, double termination, or doubly terminated. Impedance Z1 214 may be a resistor coupled between pin 210 and ground 220, and impedance Z2 216 may be a second resistor coupled between the far end of transmission path 212 and ground 220, for example.

Figure 3A:
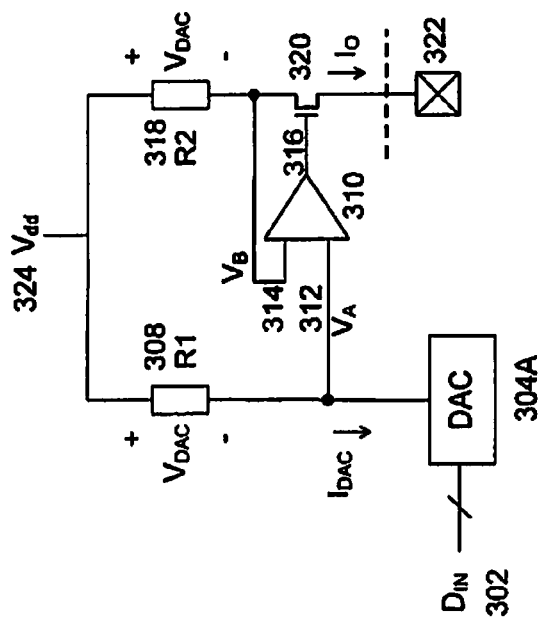
FIG. 3A illustrates one implementation of a current output DAC according to another embodiment.

FIG. 3A illustrates a circuit 300A including a current output DAC 304A according to another embodiment. In this example, a current output DAC 304A receives a digital signal 302 (Din) and outputs a current Idac. A current buffer in the integrated circuit 300A has an amplifier 310 including a first input 312, a second input 314, and an output 316. An output of current output DAC 304A is coupled to the first input 312 of the amplifier 310. A first resistor R1 308 is coupled between the output of current output DAC 304A and a power supply terminal $V_{dd}$ 324. A second resistor R2 318 is coupled between the second input 314 of amplifier 310 and the power supply terminal $V_{dd}$ 324. A transistor 320 has a control terminal coupled to an output 316 of amplifier 310. One terminal of transistor 320 is coupled to the second input of amplifier 314 and the other terminal of transistor 320 is coupled to pin 322 of integrated circuit 300A.

Integrated circuit 300A in FIG. 3A operates in the following fashion. Current output DAC 304A receives digital signal $D_{IN}$ and outputs analog output current $I_{DAC}$ corresponding to the digital signal $D_{IN}$. For example, current output DAC 304A may receive sequential digital values Din and output a sequence of analog output current values corresponding to the digital values at the input. Resistor R1 308 converts the first analog output current $I_{DAC}$ into an analog voltage. $I_{DAC}$ causes a voltage drop, $V_{DAC}$, across resistor R1 308. The resulting analog voltage is denoted $V_A$, which is Vdd–$V_{DAC}$. In this example, the first input 312 of amplifier 310 is connected to resistor R1 308 and the output of current output DAC 304A to receive the analog voltage $V_A$. Amplifier 310 as configured and shown in FIG. 3 will maintain a voltage $V_B$ at the second input 314 of amplifier 310 at substantially the same as voltage $V_A$ (e.g., $V_A=V_B$). Since $V_A=V_B$, it follows that the voltage drop across resistor R2 318 is also $V_{DAC}$. Resistor R2 318 converts the analog voltage $V_A$ (i.e., Vdd–$V_{DAC}$) into another analog current $I_O$, which passes through transistor 320 to pin 322 of integrated circuit 300. Accordingly, amplifier 310, resistor R1 308, resistor R2 318, and transistor 320 provide one example of a means for buffering the analog output current $I_{DAC}$ from current output DAC 304A and generating a second analog output current $I_O$ that may be provided to a pin for driving external circuitry.

Figure 3B:
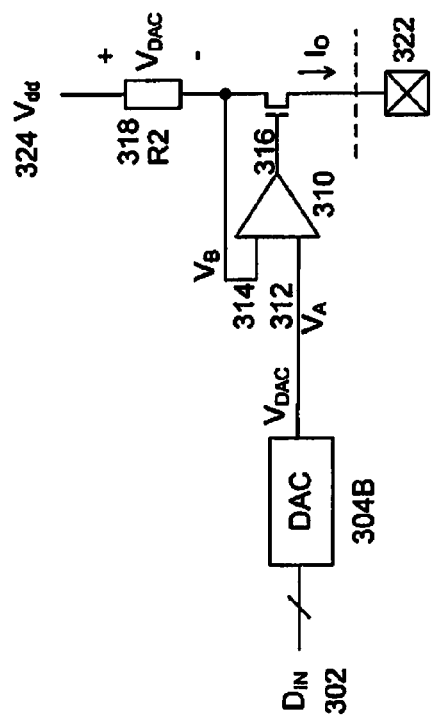
FIG. 3B illustrates one implementation of a voltage output DAC according to another embodiment.

FIG. 3B illustrates a circuit 300B including a voltage output DAC 304B according to another embodiment. In this example, a voltage output DAC 304B receives a digital signal 302 (Din) and outputs a voltage Vdac. A current buffer in the integrated circuit 300B has an input coupled to the output of voltage DAC 304B. The current buffer is constructed substantially the same as disclosed above in FIG. 3A, except no current to voltage transformation is required because DAC 304B generates a voltage output.

Figure 4:
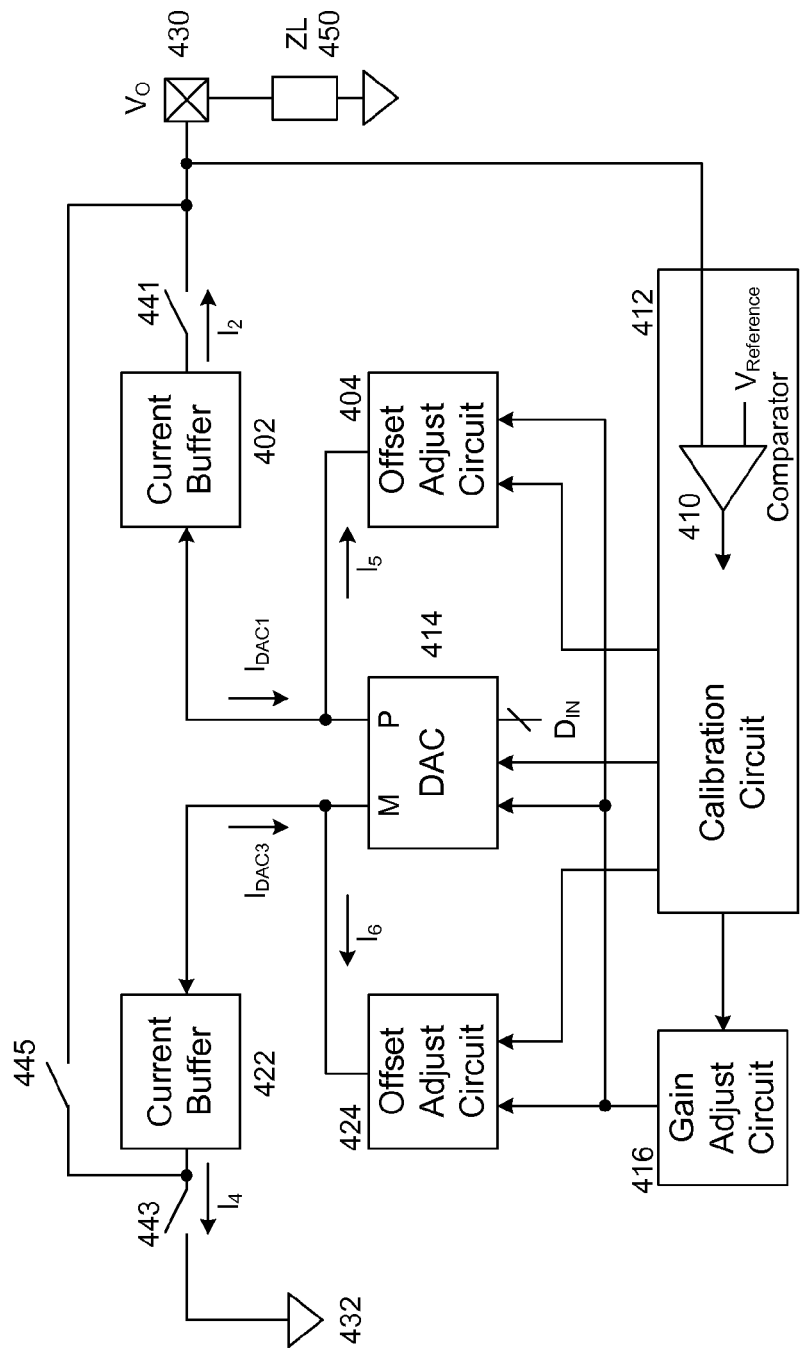
FIG. 4 illustrates an example of a DAC according to another embodiment.

FIG. 4 illustrates an example of an implementation according to another embodiment. In this example, an integrated circuit 400 includes a current output DAC 414 that receives a digital signal Din and outputs a first analog output current $I_{DAC1}$ corresponding to Din on an output (P). The output of current output DAC 414 is coupled to an input of a current buffer 402. Current buffer 402 produces an analog output current I2 that is coupled a pin 430. In some applications it may be advantageous to adjust a voltage at pin 430 resulting from coupling current I2 to external circuitry. Accordingly, in this example, integrated circuit 400 includes an offset adjust circuit 404. Offset adjust circuit 404 has an output coupled to the output of current output DAC 414 and the input of current buffer 402. Offset adjust circuit 404 produces a current I5. Current I5 may source current to or sink current from (depending on the implementation) the input of current buffer 402 to compensate for an offset of current buffer 402 appearing at pin 430, for example. In this example, analog output current I2 is coupled to a load denoted ZL 450 to generate a voltage Vo at pin 430. Voltage Vo is coupled to one input of a comparator 410, which may be included as part of a calibration circuit 412, for example. Comparator 410 compares Vo a reference voltage Vreference. Vreference sets a threshold for comparator 410. The output of comparator 410 is coupled to other circuitry in calibration circuit 412 (e.g., calibration logic), which, in turn, controls offset adjust circuit 404. In one embodiment, comparator 410 may sense voltage Vo at pin 430 of integrated circuit 400 and cause calibration circuit 412 to adjust current I5, which changes $I_{DAC1}$ and propagates through current buffer 402 to adjust the offset of the analog output current I2. Calibration circuit 412 and offset adjust circuit 404 may change an amount of sourcing or sinking of current I5 so that the voltage Vo at pin 430 meets a threshold. For example, initially current I5 may be zero and the voltage Vo may be below Vreference. Calibration circuit 412 may receive a signal from comparator 410 indicating that Vo is below Vreference and generate a signal to cause offset adjust circuit 404 to increase current I5. As current I5 increases, output current I2 may also increase, which causes voltage Vo to increase. Offset adjust circuit may continue to increase current I5 until voltage Vo meets a threshold set by Vreference. In this manner, circuit 400 may set a particular output voltage or current for each value of a digital signal Din and corresponding output current $I_{DAC1}$.

The implementation shown in FIG. 4 illustrates another feature that may be advantageous in particular embodiments. In some applications, such as high frequency video applications, fast changes in output current I2 may result in distortion caused by power supply limitations of the current buffer 402. In one embodiment, a symmetric circuit is used to maintain a substantially constant net current drawn by the current buffer from the power supply. In this example, current output DAC 414 receives digital signal Din that is converted into two output currents, $I_{DAC1}$ and $I_{DAC3}$, on two outputs (M) and (P). The second output (M) produces an analog output current $I_{DAC3}$ that is complementary to the analog output current $I_{DAC1}$. The M output is similarly coupled to current buffer 422. Current buffer 422 produces an analog output current I4, which in this example is coupled a ground. Current buffer 422 may convert $I_{DAC3}$ into an analog voltage and then convert the analog voltage back into analog output current $I_4$. Current buffer 422 may be implemented using the circuit of FIG. 3, for example, or another circuit substantially the same as used for current buffer 402. Since current $I_{DAC3}$ is complementary to current $I_{DAC1}$ and the current buffer circuits 402 and 422 are substantially the same, output current I2 is also complementary to output current I4. The result is that the net current drawn by current buffer 402 and current buffer 422 (e.g., from a power supply voltage) is substantially constant, which advantageously reduces the amount of distortion.

Circuit 400 further includes a second offset adjust circuit 424. Similar to offset adjust circuit 404, offset adjust circuit 424 sources or sinks current I6 to an input of the second current buffer 422 to compensate for an offset of the second current buffer 422. In this example, the circuit may be reconfigured to calibrate each offset adjust circuit 404 and 424 by selectively opening and closing switches 441, 443, and 445. For instance, during calibration of offset adjust circuit 404, switches 441 and 443 are closed and switch 445 is open. During calibration of offset adjust circuit 424, switches 441 and 443 are open and switch 445 is closed so that the output of current buffer 422 is coupled to comparator input of the calibration circuit 412.

The implementation shown in FIG. 4 illustrates another feature that may be advantageous in particular embodiments. Circuit 400 further includes a gain adjust circuit 416. Gain adjust circuit 416 may be used to adjust the gain of one or more of current output DAC 414, offset adjust circuit 404, or offset adjust circuit 424. For instance, if a particular range of output current values for analog output current I2 are desired for a corresponding set of digital signal values, Din, gain adjust circuit 416 may be used to increase or decrease such range.

Similarly, one or both of the offset adjust circuits 404 and 424 may be configured to produce a range of offset currents I5 and I6 for a corresponding set of input values from calibration circuit 412. Gain adjust circuit 416 may similarly sense voltage at pin 430 and compare output voltage Vo to one or more thresholds to calibrate current output DAC 414 and offset adjust circuits 404 and 424.

Figure 5:
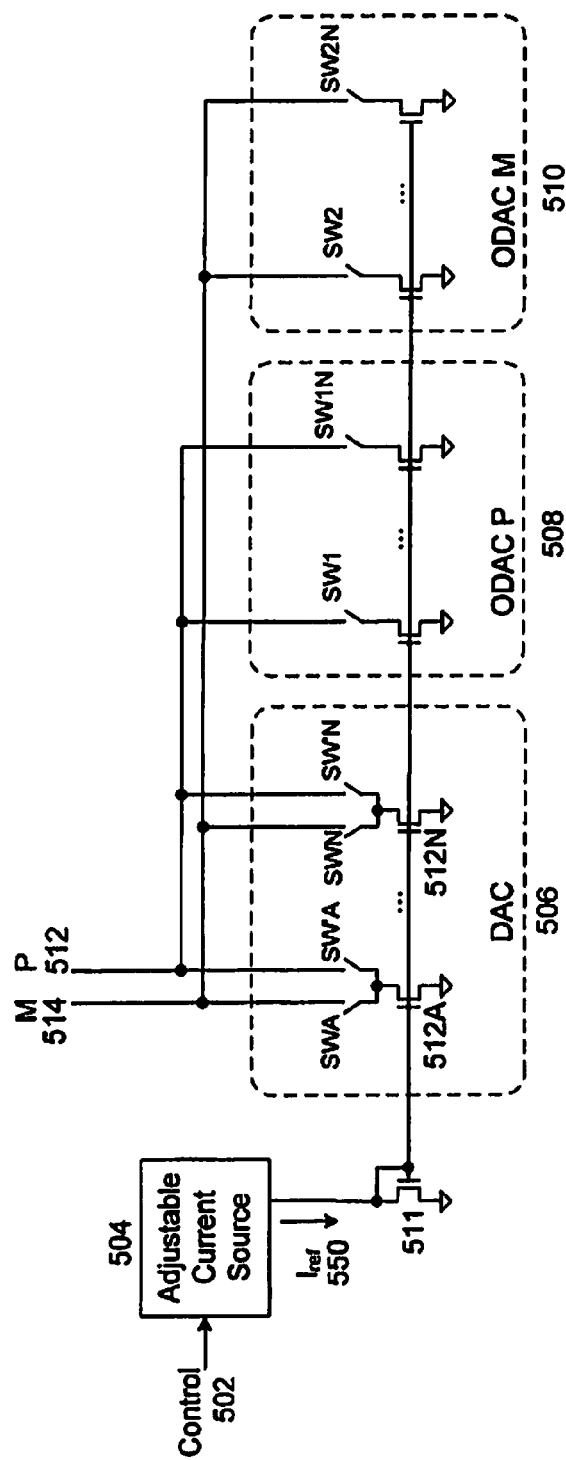
FIG. 5 illustrates an example of a DAC with offset and gain adjust circuits according to another embodiment.

FIG. 5 illustrates an example of a current output DAC with offset and gain adjust circuits according to another embodiment. In this example, an adjustable current source 504 provides a reference current Iref 550, which is coupled to current steering circuits in a current output DAC 506 and selectable current sources in a first offset DAC 508 and a second offset DAC 510. Offset DACs 508 (ODAC P) and 510 (ODAC M) are examples of offset adjust circuits of FIG. 4. More particularly, current output DAC 506 includes multiple stages of current steering circuits. Reference current Iref is coupled through a current mirror including transistor 511 and transistors 512A-N to either an output 514 (M) or an output 512 (P) of current output DAC 506 based on the state of switches SWA-SWN and SW'A-SW'N, where each switch pair SWA/SW'A are controlled by complementary digital bits. Reference current Iref is mirrored through each stage to either the M output 514 or P output 512 of current output DAC 506. Reference current Iref may increase or decrease as it is coupled to the current steering stages in current output DAC 506 by changing the W/L ratio of the mirror, for example. Gain adjust is provided by adjustable current source 504. Adjustable current source 504 receives a control signal 502 which changes the reference current Iref. Control signal 502 may be a digital logic signal from a calibration circuit as illustrated in FIG. 4, for example. Changing the reference current Iref changes the range of the current output DAC 506.

Similarly, offset adjust is implemented in this example by selectively coupling reference current Iref to outputs 514 and 512 of current output DAC through an offset DAC 508 and an offset DAC 510. Offset DAC 508 includes switches SW1-SW1N to selectively couple current to output 512 of current output DAC 506. Similarly, offset DAC 510 includes switches SW2-SW2N to selectively couple current to output 514 of current output DAC 506. Switches SW1-SW1N and SW2-SW2N may be controlled by digital logic signals from a calibration circuit, for example, as illustrated in FIG. 4

The above description illustrates various embodiments of the present disclosure along with examples of how aspects of the present disclosure may be implemented. The above examples and embodiments should not be deemed to be the only embodiments, and are presented to illustrate the flexibility and advantages of the present disclosure as defined by the following claims. Based on the above disclosure and the following claims, other arrangements, embodiments, implementations and equivalents will be evident to those skilled in the art and may be employed without departing from the scope of the disclosure as defined by the claims.

What is claimed is:

1. A system, comprising:
a converter configured to provide, based on a digital input signal, a first output current;
a buffer configured to provide, based on the first output current, a second output current to an output pin; and
an offset adjust circuit in communication with the first output current, the offset adjust circuit configured to, based on a comparison between a reference signal and the second current at the output pin, adjust the first output current to compensate for a current offset at the output pin.

2. A system, comprising:
a converter configured to provide, based on a digital input signal, a first output current;
a buffer configured to provide, based on the first output current, a second output current to an output pin; and
an offset adjust circuit in communication with the first output current, the offset adjust circuit configured to, based on the second current at the output pin, adjust the first output current to compensate for a current offset at the output pin,
wherein i) the converter and the buffer are implemented on an integrated circuit, and ii) the output pin corresponds to an output pin of the integrated circuit.

3. The system of claim 2, wherein the offset adjust circuit is configured to provide an adjustment current to adjust the first output current to compensate for the current offset at the output pin.

4. The system of claim 2, further comprising a calibration circuit configured to control the offset adjust circuit based on the second output current at the output pin.

5. The system of claim 4, further comprising a gain adjust circuit configured to adjust a gain of at least one of the converter and the offset adjust circuit.

6. A system, comprising:
a converter configured to provide, based on a digital input signal, a first output current;
a buffer configured to provide, based on the first output current, a second output current to an output pin;
an offset adjust circuit in communication with the first output current, the offset adjust circuit configured to, based on the second current at the output pin, adjust the first output current to compensate for a current offset at the output pin; and
a calibration circuit configured to control the offset adjust circuit based on the second output current at the output pin,
wherein the calibration circuit is configured to control the offset adjust circuit further based on a comparison between i) an output voltage corresponding to the second output current, and ii) a reference voltage.

7. A system, comprising:
a converter configured to provide, based on a digital input signal, a first output current;
a buffer configured to provide, based on the first output current, a second output current to an output pin; and
an offset adjust circuit in communication with the first output current, the offset adjust circuit configured to, based on the second current at the output pin, adjust the first output current to compensate for a current offset at the output pin,
wherein the converter is further configured to provide, based on the digital input signal, a third output current, the system further comprising:

a second buffer configured to provide, based on the third output current, a fourth output current to the output pin; and
a second offset adjust circuit in communication with the third output current, the second offset adjust circuit configured to, based on the fourth current at the output pin, adjust the third output current to compensate for the current offset at the output pin.

8. The system of claim 7, wherein i) the first current and the third current are complementary, and ii) the second current and the fourth current are complementary.

9. The system of claim 7, further comprising:
a first switch connected between the buffer and the output pin;
a second switch connected between the second buffer and the output pin; and
a third switch connected between the second buffer and a reference potential,
wherein the offset adjust circuit and the second offset adjust circuit are configured to be calibrated by selectively opening and closing the first switch, the second switch, and the third switch.

10. A method, comprising:
providing, based on a digital input signal, a first output current;
providing, based on the first output current, a second output current to an output pin; and
using an offset adjust circuit in communication with the first output current, adjusting, based on a comparison between a reference signal and the second current at the output pin, the first output current to compensate for a current offset at the output pin.

11. A method, comprising:
providing, based on a digital input signal, a first output current;
providing, based on the first output current, a second output current to an output pin; and
using an offset adjust circuit in communication with the first output current, adjusting, based on the second current at the output pin, the first output current to compensate for a current offset at the output pin,
wherein the output pin corresponds to an output pin of an integrated circuit.

12. The method of claim 11, further comprising providing an adjustment current to adjust the first output current to compensate for the current offset at the output pin.

13. The method of claim 11, further comprising controlling the offset adjust circuit based on the second output current at the output pin.

14. The method of claim 13, further comprising adjusting a gain associated with at least one of the offset adjust circuit and the first output current.

15. A method, comprising:
providing, based on a digital input signal, a first output current;
providing, based on the first output current, a second output current to an output pin;
using an offset adjust circuit in communication with the first output current, adjusting, based on the second current at the output pin, the first output current to compensate for a current offset at the output pin;
controlling the offset adjust circuit based on the second output current at the output pin; and
controlling the offset adjust circuit further based on a comparison between i) an output voltage corresponding to the second output current, and ii) a reference voltage.

16. A method, comprising:
  providing, based on a digital input signal, a first output current;
  providing, based on the first output current, a second output current to an output pin;
  using an offset adjust circuit in communication with the first output current, adjusting, based on the second current at the output pin, the first output current to compensate for a current offset at the output pin;
  providing, based on the digital input signal, a third output current;
  providing, based on the third output current, a fourth output current to the output pin; and
  using a second offset adjust circuit in communication with the third output current, adjusting, based on the fourth current at the output pin, the third output current to compensate for the current offset at the output pin.

17. The method of claim 16, wherein i) the first current and the third current are complementary, and ii) the second current and the fourth current are complementary.

* * * * *